(12) United States Patent
Das et al.

(10) Patent No.: US 9,170,961 B2
(45) Date of Patent: Oct. 27, 2015

(54) LOCATION OF COMPUTING ASSETS WITHIN AN ORGANIZATION

(75) Inventors: Rajarshi Das, Armonk, NY (US); Metin Feridun, Thalwil (CH); Canturk Isci, Secaucus, NJ (US); Jonathan Lenchner, North Salem, NY (US); Suzanne K. McIntosh, Clifton, NJ (US); Michael E. Nidd, Zurich (CH); Axel Tanner, Kilchberg (CH); Bo Yang, Beijing (CN)

(73) Assignee: International Business Machines Corporation, Armonk, NY (US)

( * ) Notice: Subject to any disclaimer, the term of this patent is extended or adjusted under 35 U.S.C. 154(b) by 600 days.

(21) Appl. No.: 13/564,303

(22) Filed: Aug. 1, 2012

(65) Prior Publication Data
US 2014/0006672 A1      Jan. 2, 2014

Related U.S. Application Data

(63) Continuation of application No. 13/540,122, filed on Jul. 2, 2012.

(51) Int. Cl.
*G06F 17/00* (2006.01)
*G06F 13/14* (2006.01)

(52) U.S. Cl.
CPC ...................... *G06F 13/14* (2013.01)

(58) Field of Classification Search
CPC .......... G06F 17/00; G06F 15/00; G06K 13/14
USPC .................... 235/375, 383; 705/305; 710/305
See application file for complete search history.

(56) References Cited

U.S. PATENT DOCUMENTS

| | | | |
|---|---|---|---|
| 7,805,473 B2 | 9/2010 | Ward | |
| 2006/0171538 A1 | 8/2006 | Larson et al. | |
| 2007/0005382 A1 | 1/2007 | Sayers | |
| 2011/0210167 A1 | 9/2011 | Lyon | |
| 2013/0117359 A1* | 5/2013 | Husain et al. | 709/203 |
| 2013/0290694 A1* | 10/2013 | Civilini et al. | 713/2 |
| 2014/0039683 A1* | 2/2014 | Zimmermann et al. | 700/275 |

OTHER PUBLICATIONS

U.S. Appl. No. 13/540,122.
Disclosed Anonymously, "Location Directed IT Asset Process Automation", IPCOM000203797D, Feb. 2, 2011, 3 pages.
IBM, "Method and System to Locate Virtual Machine in a Datacenter Environment", IPCOM000175766D, Oct. 24, 2008, 15 pages.

* cited by examiner

*Primary Examiner* — Edwyn Labaze
(74) *Attorney, Agent, or Firm* — Stephen J. Walder, Jr.; Preston J. Young

(57) ABSTRACT

Mechanisms are provided for determining the location of computing assets within an organization. These mechanisms determine first location information identifying a location of at least one first physical asset housing in a predetermined physical area of the organization relative to a predetermined coordinate system, and second location information identifying a location of at least one second physical asset housing within the at least one first asset housing. The mechanisms automatically determine third location information identifying a location of at least one computing asset within the at least one second physical asset housing. In addition, the mechanisms generate an asset location map data structure for the organization based on the first, second and third location information. The mechanisms also perform at least one management operation for managing resources of the organization, based on the asset location map data structure for the organization.

20 Claims, 5 Drawing Sheets

LOCATION OF COMPUTING ASSETS WITHIN AN ORGANIZATION

BACKGROUND

The present application relates generally to an improved data processing apparatus and method and more specifically to mechanisms for locating computing assets within an organization.

Mapping assets within a building, or even a room, is a tedious, error-prone, and time consuming process. This is especially true with regard to data centers where large numbers of computing resources may be located within the physical premises of a building or room of a building and it is important for administrators to know the whereabouts of such resources.

Currently, the only solution for obtaining the location of data center resources is for a system administrator, or other human personnel, to manually note the exact location coordinates of the resources for every resource or asset. This is an error prone process which requires frequent manual updates possible only if the data center is faithfully monitored for asset changes such as asset relocation, asset removal, and asset addition. With this manual process, the recorded location of assets is difficult to synchronize with events in the data center; the recorded locations are often stale. Even if barcoding is used to assist this process, the asset records will not match until an administrator scans the assets' barcodes and updates the location information manually.

SUMMARY

In one illustrative embodiment, a method, in a data processing system, is provided for determining the location of computing assets within an organization. The method comprises determining, by the data processing system, first location information identifying a location of at least one first physical asset housing in a predetermined physical area of the organization relative to a predetermined coordinate system. The method further comprises determining, by the data processing system, second location information identifying a location of at least one second physical asset housing within the at least one first asset housing. Moreover, the method comprises automatically determining, by the data processing system, third location information identifying a location of at least one computing asset within the at least one second physical asset housing. In addition, the method comprises generating an asset location map data structure for the organization based on the first, second and third location information. The method also comprises performing, by the data processing system, at least one management operation for managing resources of the organization, based on the asset location map data structure for the organization.

In other illustrative embodiments, a computer program product comprising a computer useable or readable medium having a computer readable program is provided. The computer readable program, when executed on a data processing system comprising at least one processor and at least one memory, causes the data processing system to perform various ones of, and combinations of, the operations outlined above with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various ones of, and combinations of, the operations outlined above with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION

Figure 1:
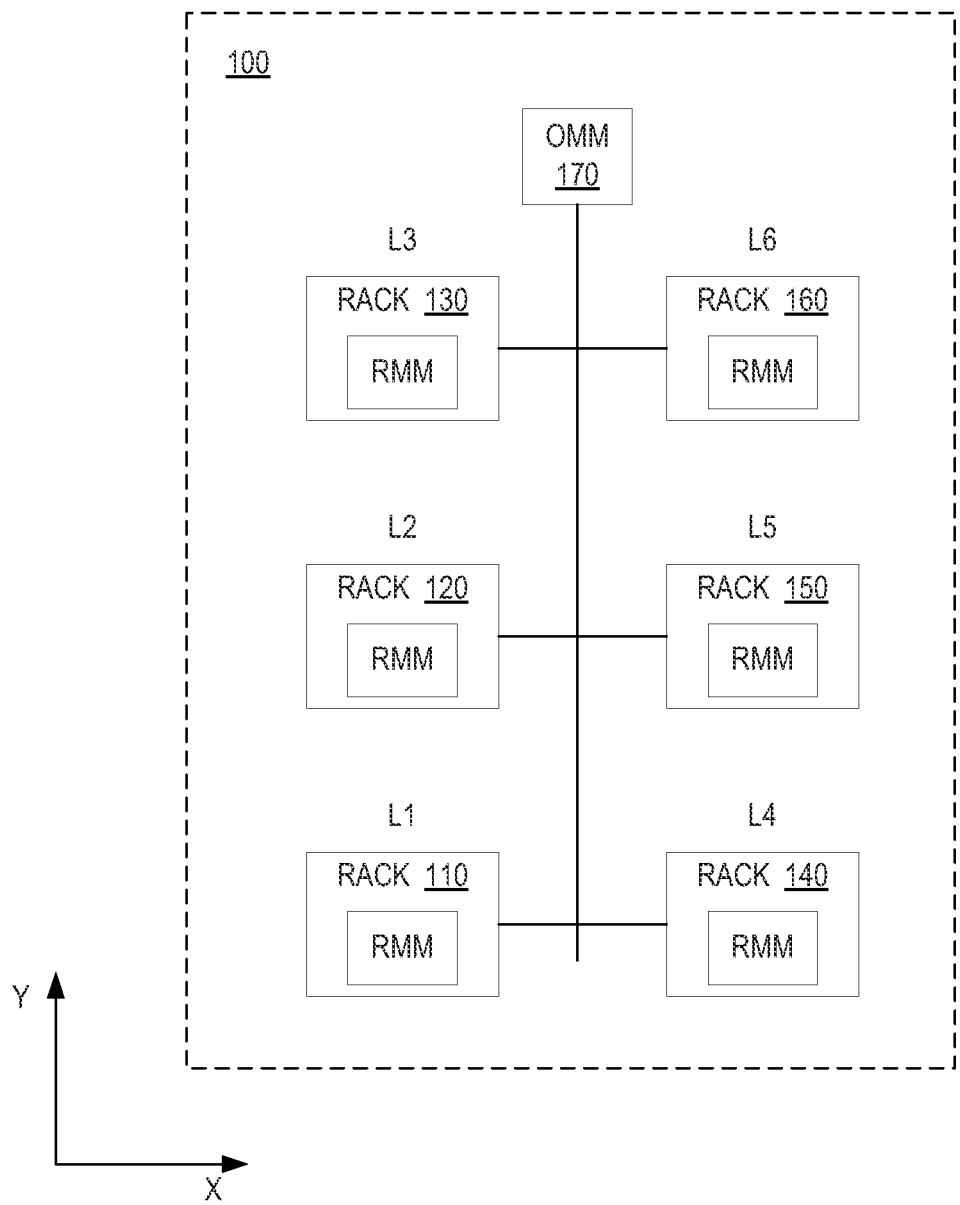
FIG. 1 is an example diagram illustrating the physical location of assets within an organization in accordance with one illustrative embodiment.

The illustrative embodiments provide a mechanism for automatically determining the location of computing assets, such as blade servers, for example, within an organization, such as a data center, for example. The mechanisms of the illustrative embodiments leverage the data held in the management module of a blade center chassis to assist in the location of assets within the data center. The data maintained in the management module is used along with information about rack placement within the data center and chassis placement within the rack to determine the location of assets within the data center.

With the mechanisms of the illustrative embodiments, each asset, such as each blade server, in the data center may be located in three-dimensional space with minimal effort on the part of a system administrator or other human personnel. That is, once the location of all racks in the data center, and the heights at which all chassis are positioned has been captured in the management module, the values of these locations will rarely change. Blade servers, on the other hand, are often moved around in a data center, removed, or added. With the mechanisms of the illustrative embodiments, the new locations of the blade servers are automatically recalculated without the need for manual modifications to the location data by a system administrator or other human personnel.

The illustrative embodiments will be described herein with regard to the location of blade servers, or blades, within a data center. However, it should be appreciated that the illustrative embodiments may be utilized to locate any asset of a computing system, such as a data center or the like, for which management information is maintained. For purposes of the following description it is assumed that the data center is comprised of one or more racks "r," where each of the racks comprises a plurality of chassis "c," and wherein each chassis may store one or more blade servers "b," or blades. Thus, for example, a rack "r" may store c*b blade servers, e.g., if a rack comprises 5 chassis and each chassis can hold up to 14 blade servers, then the rack may hold up to 14*5=70 blade servers or blades.

The illustrative embodiments may maintain and track the location of these blade servers automatically after having an initial input of coordinates for the rack and chassis. That is, at initialization time, a system administrator or other human personnel may enter the x and y coordinates for the rack in which the chassis reside. The system administrator may further specify the z location of the chassis within the rack. This information, along with an association of the rack as the parent for the chassis is stored in the management module. The racks may have one or more blade server chassis installed. Each chassis has an associated chassis control module that identifies the type of blade servers, if any, that are occupying the chassis slots. The management module may obtain the slot and blade server information from the one or more chassis control modules. Thus, the management module maintains the x, y, and z location of each chassis as well as what blade servers are located in each of the slots of each of the chassis.

The management module may be centralized to a plurality of racks of an organization, such as a data center or the like. Alternatively, each rack in the plurality of racks may have an associated management module that operates in accordance with the illustrative embodiments described herein. In some illustrative embodiments, the management modules of the various racks may coordinate information with each other such that each management module may maintain a map of the organization, e.g., the data center, with regard to the physical location of assets within the organization.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a Local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 1 is an example diagram illustrating the physical location of assets within an organization in accordance with one illustrative embodiment. In the depicted example, for simplicity of the example the organization is considered to be a data center comprised of a single large room having a plurality of assets provided in various locations within the single large room. However, it should be appreciated that in other implementations, the mechanisms may be used with larger organizations having multiple rooms at the same or different geographical locations, at various different elevations such as on different floors of a building, or the like. For purposes of the following description of the illustrative embodiments, it will be assumed that the organization is a data center in which blade servers are provided for servicing client requests. However, the illustrative embodiments should not be considered to be limited to data centers or blade servers but instead may be used with any organization or type of computing device where the physical location of the computing device within the organization is to be tracked.

As shown in FIG. 1, the data center 100 comprises a plurality of racks 110-160 located at various locations L1-L6 within the data center 100. Each rack 110-160 may comprise one or more chassis (not show), and each chassis may have one or more slots for installation of blade servers. Each of the chassis may have a chassis management module that, among other management operations, identifies slots in the chassis and what blade servers, if any are in the various slots of the chassis. The chassis management module may further gather vital product data and other configuration information from the blade servers in the various slots of the chassis and may communicate this information to a rack management module (RMM) associated with the rack 110-160. Thus, the RMM of a rack 110-160 maintains information about each of the chassis in the rack 110-160 and their associated blade servers. Moreover, the chassis management module detects when a new blade server has been added to a slot in the chassis and when an existing blade server has been removed from a slot in the chassis. This information may likewise be communicated to the RMM so that the RMM can identify when blade servers have been added to or removed from the rack 110-160.

The RMM of the rack 110-160, upon installation of the rack at the designated location L1-L6 is configured with the rack's physical location within the data center 100. In one illustrative embodiment, this physical location is provided in terms of x and y coordinates with reference to an established coordinate reference. Thus, for example, rack 110 has a location L1 comprised of x and y components (x1, y1). Similarly, rack 160 has a location L6 comprised of x and y components (x6, y6). These coordinates uniquely identify the location of the rack within a pre-defined physical space of the organization, i.e. the data center 100 in this example.

The location of the rack 110-160 may be programmed into the RMM of the rack 110-160 by a human system administrator in response to initializing the rack 110-160 at the designated location and may be maintained in the configuration information of the RMM. Alternatively, the location of the rack 110-160 may be obtained through an automated mechanism, such as a global positioning system, cellular based triangulation mechanism, bar code reading mechanism, or any other automated mechanism capable of discerning the physical location of the rack within a pre-defined physical space.

The rack 110-160 may comprise one or more chassis slots at various vertical positions in the rack 110-160. Thus, each chassis in the rack 110-160 may be located at a different vertical location, or chassis slot, within the rack 110-160. Hence, a chassis may be located at a rack vertical position z in the coordinate system of the organization. The rack 110-160 may have, for example, chassis slots at positions z1-z5 (five chassis slots each at a different vertical z position in the rack). The location of the chassis in the rack 110-160 is maintained by the RMM of the rack 110-160 such that the rack 110-160 is considered the parent entity of the chassis and thus, the location of the rack 110-160 L1-L6 is considered the location of the chassis as well, but each chassis has its own unique vertical location within the parent rack 110-160. Thus, each chassis has its own unique chassis location comprising the x and y coordinates of the parent rack 110-160 and the z coordinate of the chassis slot in which the chassis is resident within the parent rack 110-160, i.e. a unique chassis location comprising x, y, and z coordinates. Thus, for example, a chassis at a chassis slot having a vertical location z2 in rack 110 would have a unique location of (x1, y1, z2). The vertical location of each of the chassis in the rack 110-160 may be automatically determined by the RMM upon initialization and configuration of the rack 110-160 if the chassis is equipped with GPS, RFID/RFID reader, barcode and scanner, or some other mechanism for discovering its location, and communicating the location to the RMM. Alternatively, the location coordinates may be manually input for use by the RMM.

The information gathered and maintained in the RMM of each of the racks 110-160 may be communicated to an organization management module (OMM) 170. The OMM 170 may maintain the location information of each of the racks, chassis, and blade servers in the organization, e.g., the data center 100. That is, the OMM 170 obtains the configuration information from the RMMs which includes the location L1-L6 of the rack 110-160 in terms of x and y coordinates, for example, and the relative location of the chassis within the rack 110-160, e.g., the z coordinate within the rack 110-160. Moreover, the RMM provides the configuration information of the various blade servers installed in each of the chassis of the corresponding rack 110-160 as obtained from the chassis management modules of the chassis in the rack 110-160. Thus, the OMM 170 has all of the location information for all of the rack 110-160, chassis, and blade server assets within the data center 100.

The obtaining, by the OMM 170, of the configuration information from the RMMs of the racks 110-160 may be done periodically, continually, or in response to predetermined events. For example, the OMM 170 may request configuration information from the RMMs at a predetermined schedule, e.g., once per day, week, month, etc. As another example, the RMMs may push configuration information to the OMM 170 in response to certain events occurring, such as the addition of a new blade server to a chassis in the corresponding rack 110-160, the removal of a blade server from a chassis in the corresponding rack 110-160, or the like. In still another example, the RMMs may push configuration information to the OMM 170 at regular scheduled intervals of time. Moreover, a combination of push and/or pull operations for obtaining configuration information from the RMMs may be used by the OMM 170 on a periodic, continual, and/or event basis. That is, any periodic, continual, or event based collection or configuration information from the RMMs by the OMM 170 may be used without departing from the spirit and scope of the illustrative embodiments.

One of the benefits of the operation of the illustrative embodiments is that after an initialization operation for entering the location information of the rack 110-160 in the predefined physical space of the organization with regard to a reference coordinate system, no further manual input by a human system administrator is necessary, and in embodiments where the location of the racks 110-160 may be determined automatically, the initial manual input of location information can even be eliminated. That is, once the location L1-L6 of the racks 110-160 is known by RMMs of the racks 110-160, the addition, removal, and movement of blade servers within the organization, e.g., data center 100, may be automatically tracked.

For example, assuming that each of the locations of racks 110-160 have been input or otherwise automatically determined and stored in the RMM of racks 110-160, the RMMs know their current location L1-L6. Furthermore, through initialization, the RMMs know the chassis present in the racks 110-160 and their corresponding vertical location within the rack 110-160. The chassis control modules communicate blade server information in response to the addition/removal of blade servers to the chassis when queried by the RMM. Thus, as blade servers are added/removed from chassis, their slot location, chassis location, and rack location is automatically determined and may be periodically or continually queried, or in response to the addition/removal event, communicated to the OMM 170. Hence if a blade server is removed from one slot in a first chassis in rack 110, the removal is tracked by the RMM of the rack 110 and communicated to the OMM 170 either automatically, or in response to a periodic or continual query. Subsequently, if the blade server is inserted into a slot of a chassis in rack 160, the addition is tracked by the RMM of the rack 160 and communicated to the OMM 170 either automatically, or in response to a periodic or continual query. Hence, the OMM 170 can track the movement and rearrangement of blade servers within the data center 100.

It should be appreciated that the above description makes reference to the "vertical" position of the chassis within a rack 110-160, however the invention is not limited to such. The illustrative embodiments may be used with horizontal and/or vertical position of chassis within a rack 110-160. That is, the illustrative embodiments may be used with any embodiment in which the chassis location within a rack may be determined, whether that chassis location be a vertical or horizontal location.

Figure 2:
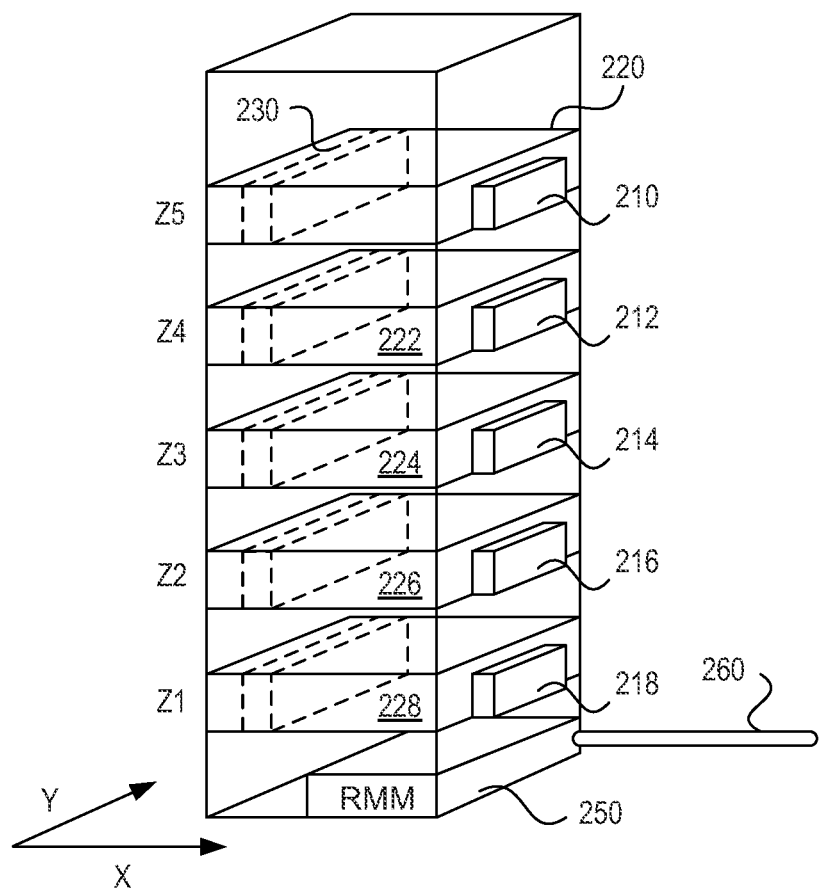
FIG. 2 is an example diagram of a rack having a plurality of vertical locations for chassis in accordance with one illustrative embodiment.

FIG. 2 is an example diagram of a rack having a plurality of vertical locations for chassis in accordance with one illustrative embodiment. As shown in FIG. 2, the rack 200 includes a plurality of chassis 220-228 provided at various vertical locations z1-z5 in the rack 200. The RMM 250 of the rack 200 manages the rack 200 and the chassis 220-228 in the rack 200. This includes performing initialization operations of the rack 200 and gathering of chassis configuration information from the various chassis management module (CMMs) 210-218 of the chassis 220-228 in the rack 200, as discussed above. Each chassis 220-228 may have one or more blade servers 230 in slots within the chassis 220-228. The CMMs 210-218 gather information about the blade servers 230 in the various slots of the corresponding chassis 220-228 include vital product data, e.g., blade server ID information, e.g., serial number or the like, address information, blade server capability information, e.g., CPU type, CPU speed, memory size, memory speed, memory configuration, etc. and further determined the slot number of identifier of the slot in which the blade server is present in the chassis 220-228. The information gathered by the CMMs 210-218 may be communicated to the RMM 250 of the rack 200 which stores and maintains the information for the rack 200.

The RMM 250 has a communication link 260, which may be wired or wireless, through which the RMM 250 may communicate information with an OMM 170 and/or other RMMs of other racks in an organization as well as receive communications from the OMM 170 and/or other RMMs in the other racks. That is, in some illustrative embodiments rather than having a centralized OMM 170 that manages the organization including all of the racks in the organization, e.g., data center, the management operations may be distributed to each of the RMMs of the racks such that each RMM communicates with each other RMM to maintain location information for all of the assets of the organization. However, for purposes of this description, it will be assumed that a centralized OMM 170 embodiment is being utilized.

The OMM 170 generates a map data structure for the organization based on the asset location information gathered from the RMMs of the racks in the organization. For example, the map data structure stores the physical location information for every rack, chassis, and blade server in the organization, e.g., a data center 100. Thus, if any management operation needs to know the physical location of an asset, this map data structure may be consulted to determine the current physical location of the asset. This map data structure is automatically updated as the configuration and/or physical locations of the racks, chassis, and/or blade servers change over time.

Many different types of management operations may be performed based on the asset configuration and location information obtained using the mechanisms of the illustrative embodiments. A large number of these management operations may be categorized as reporting and searching operations, but other management operations for actually performing operations within the organization, including load balancing, failover operations, and the like, may be managed at least partly based on the configuration and location information obtained using the mechanisms of the illustrative embodiments.

With regard to the reporting and searching operations, various reporting and searching operations may be performed based on the map data structure generated by the mechanisms of the illustrative embodiments. For example, assuming that the organization in question is a data center comprised of racks having chassis, where the chassis may hold one or more blade server assets, these reporting and searching operations may comprise one or more of the following:

1) generating a mapping of blade servers to chassis;
    2) generating a mapping of blade servers to chassis to rack;
    3) generating a mapping of chassis to rack;
    4) generating a mapping of racks within the data center;
    5) generating an interactive data center mapping display/ data structure that provides drill-down capability from an organization perspective, to a rack perspective, and further into a chassis perspective and ultimately down to the blade server asset itself;

6) generating the above mappings for multiple physical rooms of the data center, each room itself possibly being a separate sub-part of the data center that may be separately managed using the mechanism of the illustrative embodiments;

7) as part of a search operation, given a blade server asset identifier, returning the location of the blade server asset, the chassis in which it resides, the rack in which it resides, and the physical room in which it resides;

8) as part of a search operation, given a chassis identifier, returning the location of the chassis, the rack in which it resides, and the physical room in which it resides in the data center;

9) as part of a search operation, given a rack identifier, returning the location of the rack and the physical room in which it resides;

10) as part of a search operation, given the x, y, z coordinates of a location within a physical room, returning the blade server assets, chassis, and racks at or near the given coordinates within a given tolerance (e.g., 3 feet and/or 1 z location);

11) as part of a search operation, given the x and y coordinates of a location within a physical room, returning the blade server assets, chassis, and racks at or near the given coordinates within a given tolerance (e.g., 5 feet);

12) as part of a search operation, given starting and ending x, y, and z coordinates of an area within a physical room, returning the blade server assets, chassis, and racks that reside within the area, e.g., a square, rectangular, circular, or the like, defined by the given coordinates;

13) as part of a search operation, given starting and ending x and y coordinates of an area within a physical room, returning the blade server assets, chassis, and racks that reside within the area, e.g., a square, rectangular, circular, r the like, defined by the given coordinates;

14) as part of a search operation, given a blade server asset, chassis, or rack identifier, returning a list of other assets at or near the given asset, chassis, or rack identified within a given physical location range (e.g., within 5 feet);

15) as part of a search operation, given a change in the location of a blade server asset, chassis, or rack, the RMM can retain a history of locations previously inhabited by said asset and may report the changes in location over time to provide an indication of the movement of assets within the data center;

16) as part of a reporting operation, automatically providing a report of all available (unoccupied) slots in all chassis for all racks in all data center rooms, and the x, y, and z locations of those available slots;

17) as part of a reporting operation, automatically providing a report of all slots occupied for all chassis in all racks in all data center rooms;

18) as part of a reporting operation, automatically providing a report of all assets, their x, y, and z locations, along with information describing the chassis and rack in which the assets reside;

19) as part of a reporting operation, automatically providing a report of assets which have been removed from the data center, along with their last known location—assets that were present as of the last chassis control module query, but no longer are reported, either because the asset was removed or because the asset is not responding to the chassis control module; and 20) as part of a reporting operation, automatically providing a report showing blade server assets, chassis, and racks that have been newly added to a physical room or removed from a physical room.

Of course other searching and reporting operations not outlined above may be utilized with the mechanisms of the illustrative embodiments without departing from the spirit and scope of the illustrative embodiments. The OMM may provide a graphical user interface through which such searching and reporting operations are facilitated. The reports discussed above, as well as the results of the searches described above, may be presented to a system administrator or other authorized user via a display terminal, for example, where the results/reports may be provided as alphanumeric reports/displays, graphical displays, or the like. Any known manner for outputting the results of a search or for outputting various reports may be used without departing from the spirit and scope of the illustrative embodiments.

Figure 3:
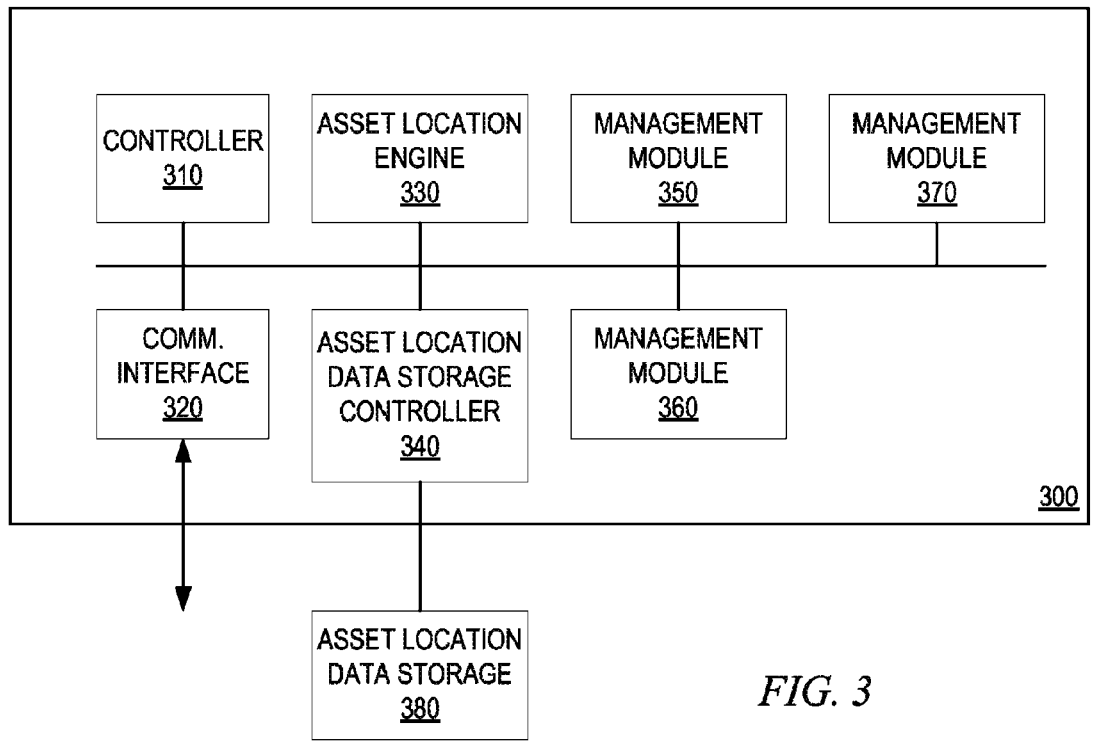
FIG. 3 is an example block diagram of a management module in accordance with one illustrative embodiment.

FIG. 3 is an example block diagram of an organization management module (OMM) in accordance with one illustrative embodiment. The elements shown in FIG. 3 may be implemented as software, hardware, or any combination of software and hardware. For example, in one illustrative embodiment, the elements in FIG. 3 may be implemented as software instructions stored in one or more memories and executed by one or more processors of one or more computing devices.

As shown in FIG. 3, the OMM 300 includes a controller 310, a communication interface 320, an asset location engine 330, an asset location data storage controller 340, and a plurality of management modules 350-370 for performing various management operations targeting individual or groups of assets in the organization. The controller 310 controls the overall operation of the OMM 300 and orchestrates the operation of the other elements 320-370. The communication interface 320 provides an interface through which asset location data may be received and data/instructions may be transmitted to the various RMMs of the racks in the organization. Such instructions/data may be of various types including configuration data/instructions, requests for information from the RMMs, instructions to perform specific operations on the RMMs, or the like.

The OMM 300 receives asset location data from RMMs of the various racks and provides the received asset location data to the asset location engine 330. The asset location engine 330 performs operations for constructing and maintaining a map of the assets in the organization which is then stored in an asset location data storage 380 via the asset location data storage controller 340. That is, for each asset, e.g., blade server, an entry is created and maintained in an asset map data structure that specifies the location of the asset as reported by the RMMs of the organization as well as any other pertinent management information, such as the vital product data, serial number, configuration information, and the like, of the asset, as received from the RMMs. Thus, when the asset is inserted into a slot of a chassis in a rack, this information is collected by the RMMs and transmitted to the OMM via the communication link and the communication interface 320. Similarly, when an asset is removed from a slot of a chassis in a rack, the removal event may be communicated by the RMM and transmitted to the OMM.

The asset map data structure may already have the location of the racks already stored in the map data structure as a result of the initialization of the rack at the racks current location. Therefore, the RMMs may send asset information to the OMM that identifies the RMM, and thus, the rack, from which the asset information is being received which as a result, identifies the location of the rack as the parent location for the asset. The remaining location information may simply specify the vertical position within the rack (and/or horizontal position within the rack) of the chassis in which the asset is installed and the slot position within the chassis that the asset is installed. As a result, for example, for a blade server asset, the OMM knows the x and y coordinates of the blade server asset from the x and y coordinates of the rack as the parent of the blade server chassis. The OMM further knows the vertical position of the blade server asset by virtue of the vertical location of the chassis in which the blade server asset is installed as communicated by the RMM of the rack. Finally, the OMM knows the particular slot within the chassis in which the blade server asset is installed as communicated by the RMM of the rack. Thus, the OMM knows the exact position of the asset within the organization. This location is tracked as the RMMs report the removal and addition of assets in the various chassis of the various racks after having obtained the initial locations of the racks.

The management modules 350-370 may be configured to perform various management operations for managing the various assets within the organization. Such management operations may include, for example, one or more of the searching/reporting operations outlined above, or other management operations that perform load balancing, failover control, or other modifications to the operations of the resources, e.g., racks, chassis, and/or blade server assets, within the organization. The management modules 350-370 may access the asset location data in the asset location data storage 380 via the asset location data storage controller 340 so that this asset location data may be used to facilitate the management operation, if necessary.

Thus, the illustrative embodiments provide a mechanism for automatically, or at least semi-automatically, obtaining location information for computing assets within an organization. The mechanisms of the illustrative embodiments require, at most, user input for specifying the initialized location of racks within the organization. Thereafter, automated mechanisms are used to obtain the location of assets within the organization based on the locations of the racks and further information automatically obtained from management modules associated with the racks. Changes to the locations of computing assets in the organization may then be automatically tracked within the organization.

Figure 4:
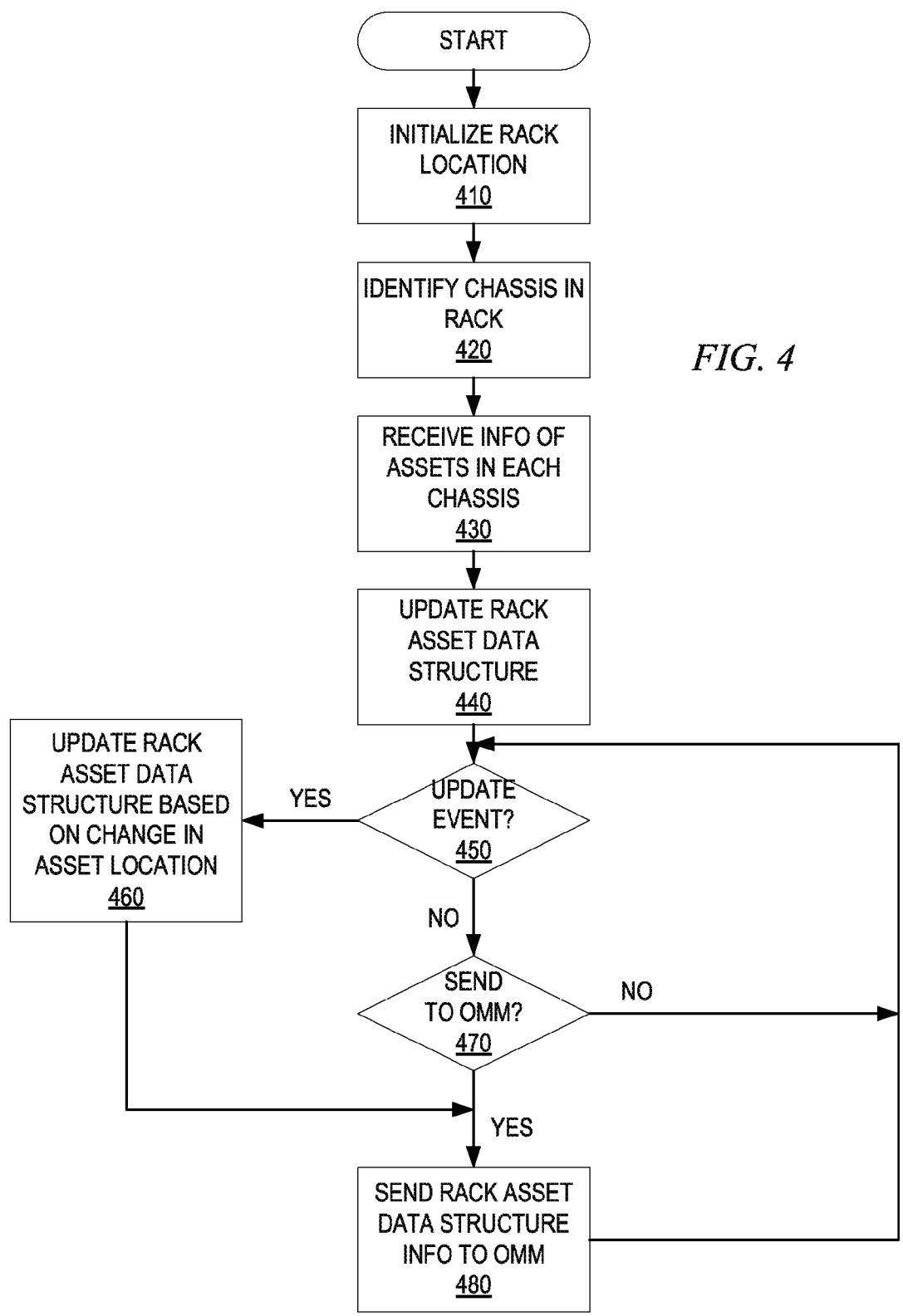
FIG. 4 is an example operation that may be implemented, for example, by a rack management module for determining location information for assets within the rack.

FIG. 4 is an example operation that may be implemented, for example, by a rack management module for determining location information for assets within the rack. As shown in FIG. 4, the rack management module (RMM) initializes itself and either automatically determines, or is informed through user input, of the rack's location within a predefined physical area of an organization (step 410). For example, this initial location of the rack may be specified by an authorized user inputting the x and y coordinates of the rack with regard to a reference coordinate system of the predefined physical area.

The RMM queries or is informed of each chassis in each vertical location (and/or horizontal location) in the rack, such as by the chassis management modules of the various chassis (step 420). For example, the RMM may be informed of the vertical z coordinate for each chassis that is currently present in the rack. The RMM is then informed, by the chassis management modules, of the particular assets installed in each of the chassis as well as their location within the chassis, e.g., the slot position (step 430). The RMM updates a rack asset data structure with the gathered information such that each chassis and asset within each chassis has an entry in the rack asset data structure specifying the location information and any vital product data, identifier data, configuration data, and the like (step 440).

A determination is made by the RMM as to whether an event has occurred within the rack requiring an update to the rack asset data structure (step 450). Such an event may be, for example, the addition of a new asset to a chassis in the rack, the removal of an asset from a chassis in the rack, or the addition/removal of a chassis to/from the rack, for example. If such an event has occurred, then the change in location information for the asset is determined and used to update the rack asset data structure (step 460). The determination of whether an event has occurred or not may be done using a polling of rack chassis control modules, for example, using a data pull operation. Alternatively, as another example, a push notification of events may be used in which the chassis control modules push event information to the RMM in response to the events occurring.

Thereafter, or if no such event has occurred, a determination is made as to whether the rack asset location information should be communicated to the organization management module (OMM) (step 470). For example, this determination may determine whether a predetermined schedule, an event, or a request from the OMM, indicates that a communication of rack asset location information is to be transmitted to the OMM. If so, then the rack asset location information is transmitted by the RMM to the OMM (step 480). If not, the operation returns to step 450. This process continues until otherwise terminated.

Figure 5:
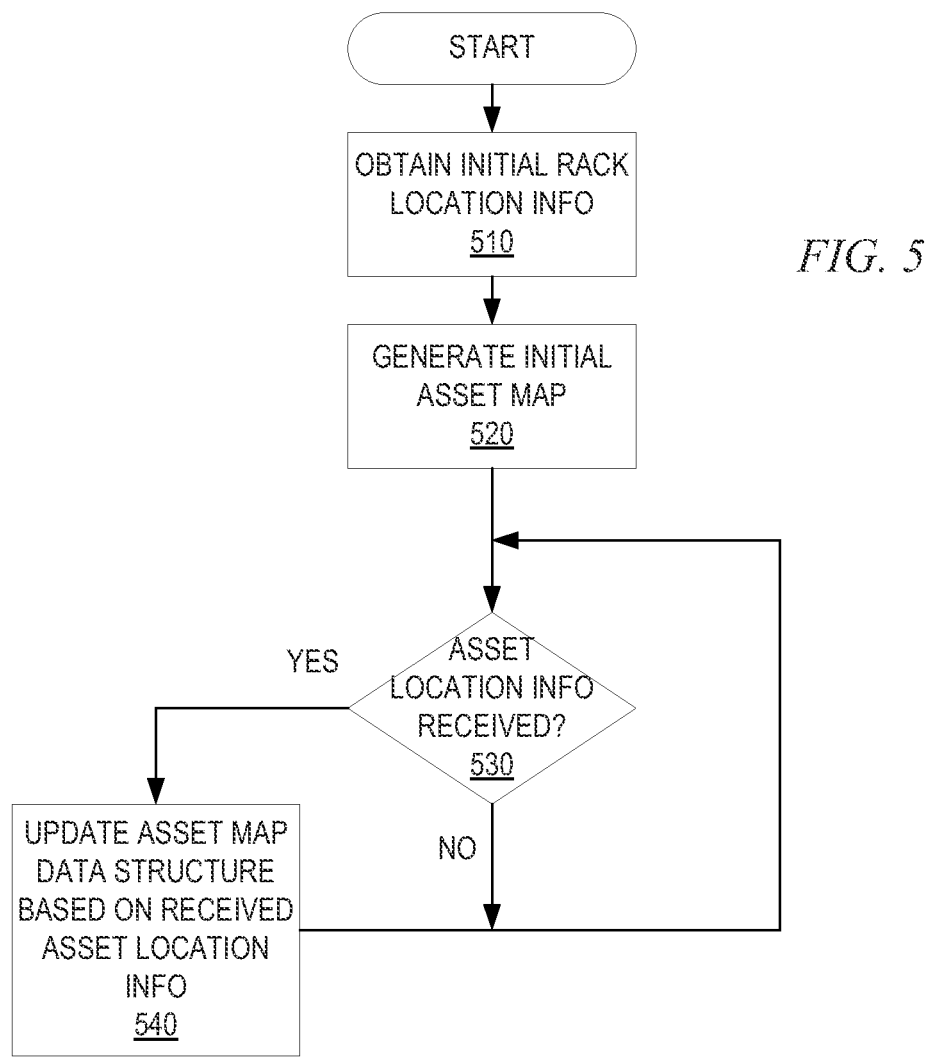
FIG. 5 is an example operation that may be implemented by an organization management module for obtaining location information for all of the assets in an organization.

FIG. 5 is an example operation that may be implemented by an organization management module for obtaining location information for all of the assets in an organization. As shown in FIG. 5, the organization management module (OMM) obtains initial information from racks as they are initialized that specifies the location of the racks in a predefined physical area relative to an established coordinate system (step 510). From this information, an initial asset map data structure for the organization is generated and stored that identifies the locations of the racks within the organization (step 520).

Thereafter, a determination is made as to whether asset location information is received from a rack management module (RMM) (step 530). If so, then the asset map data structure for the organization is updated to include the current asset information for the assets in the rack from which the asset location information is received (step 540). If no asset location information is received, then the operation returns to step 530 and continues to wait for new asset location information to be received from a RMM. This operation continues until otherwise terminated.

It should be appreciated that the above illustrative embodiments are only example embodiments and many modifications to these embodiments may be made without departing from the spirit and scope of the illustrative embodiments. For example, rather than using an architecture in which chassis control modules provide configuration information to the RMM of the racks which then provide the configuration information for the racks to the OMM, one or more of these control/management modules may be eliminated from the architecture with its operations as discussed above being adopted by one or more of the remaining control/management modules.

For example in an alternative embodiment, the RMMs in the racks may be eliminated from the architecture and the operations of the RMMs described above may be implemented in the OMM which operates as a centralized RMM for all of the racks in the organization. In such an alternative embodiment, the OMM would be initialized with the locations of all of the racks manually, for example, by a system administrator who enters a rack identifier and the associated location information, e.g., x, y coordinates, for each of the racks in the organization. The system administrator may also enter an address, e.g., URL or IP address, for each of the chassis control modules in each of the racks may be entered into the OMM in association with the previously entered rack identifier of the rack that houses the chassis control module. For each chassis control module, the system administrator may also enter the vertical/horizontal location of the chassis within the rack, e.g., the vertical location z1-z5 of the chassis within the rack. Of course, if the chassis/rack is equipped with an automated location identification mechanism, e.g., GPS or the like, then the location information for the chassis and/or rack may be automatically communicated to the OMM rather than requiring manual entry by a system administrator.

Having obtained the initial location information for the chassis and racks in the organization in this alternative embodiment, blade server asset discovery within a rack may be performed automatically and automatically tracked in a manner similar to that described above in the other illustrative embodiments. That is, the chassis control modules each have a unique address, e.g., such as unique URL skm6 cmm.watson.ibm.com and IP address, either of which can be used to query the chassis control module for configuration information. The OMM may periodically, continually, or in response to the occurrence of an event, query the chassis control modules of the chassis of the various racks for this configuration information based on this address information for the chassis. This configuration information includes the identity of the blade server assets present in the chassis including slot location within the chassis. This information may be stored in the OMM on a per-chassis, per-rack, and/or other pre-defined basis. Based on this information, the OMM may provide a cross organization, e.g., cross-data center, view of the racks, chassis, and blade server assets housed by the organization including their locations within the organization. Changes in such information may be tracked over time, such as by storing multiple versions of the table data structures storing the rack/chassis configuration/location information, to present a view of the changes in configuration and location of assets within the organization. Various reports may be generated and output to a system administrator based on this stored chassis/rack information.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

Figure 6:
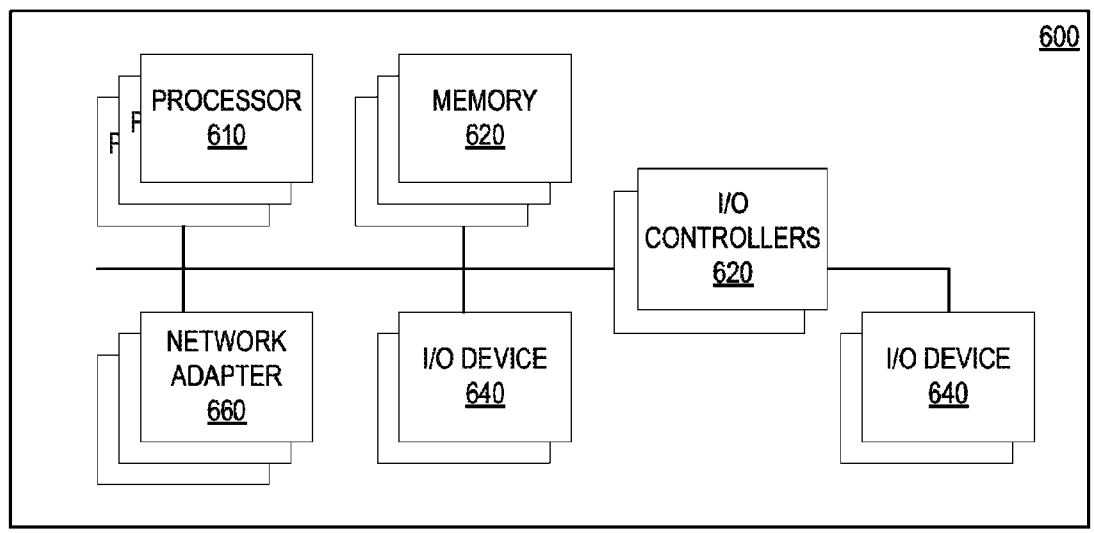
FIG. 6 is an example block diagram of a computing device which may be used to implement a management module in accordance with one illustrative embodiment.

FIG. 6 is an example block diagram of a computing device which may be used to implement a management module, such as an RMM or OMM, for example, in accordance with one illustrative embodiment. A data processing system 600 suitable for storing and/or executing program code will include at least one processor 610 coupled directly or indirectly to memory elements 620 through a system bus 630. The memory elements 620 can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) 640 can be coupled to the system either directly or through intervening I/O controllers 650. Network adapters 660 may also be coupled to the system to enable the data processing system 600 to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for determining the location of computing assets within an organization, comprising:

determining, by the data processing system, first location information identifying a location of at least one first physical asset housing in a predetermined physical area of the organization relative to a predetermined coordinate system;

determining, by the data processing system, second location information identifying a location of at least one second physical asset housing within the at least one first asset housing;

automatically determining, by the data processing system, third location information identifying a location of at least one computing asset within the at least one second physical asset housing;

generating an asset location map data structure for the organization based on the first, second and third location information; and performing, by the data processing system, at least one management operation for managing resources of the organization, based on the asset location map data structure for the organization.

2. The method of claim 1, wherein:

the at least one first physical asset housing is at least one physical rack, the at least one second physical asset housing is at least one physical chassis within the at least one physical rack, and the at least one computing asset is a blade server asset within the at least one physical chassis.

3. The method of claim 1, wherein the third location information is automatically determined periodically or in response to an occurrence of an event in one of the at least one first physical asset housing or the at least one second physical asset housing.

4. The method of claim 1, wherein the third location information is automatically determined in response to an occurrence of an event, wherein the event is one of an addition of a computing asset, in the at least one computing asset, to the at least one second physical asset housing, or a removal of the computing asset from the at least one second physical asset housing.

5. The method of claim 1, wherein the organization is a data center, and wherein the at least one first physical asset, at least one second physical asset housing, and the computing asset are located in a predefined physical area of the data center.

6. The method of claim 1, wherein the data processing system comprises a centralized organization management module that communicates directly with control modules associated with the at least one second physical asset housing to obtain the third location information.

7. The method of claim 6, wherein the centralized organization management module is configured, in response to initialization of a first physical asset housing within the organization, to include the first location information and second location information.

8. The method of claim 7, wherein the centralized organization management module is manually configured to include the first location information and second location information, and wherein the centralized organization management module automatically obtains the third location information from the control modules associated with the at least one second physical asset housing.

9. The method of claim 1, wherein the data processing system comprises at least one first physical asset housing management module associated with the at least one first physical asset housing, and a centralized organization management module, wherein the centralized organization management module obtains the first, second, and third location information from the at least one first physical asset housing management module.

10. A method, in a data processing system, for determining the location of computing assets within an organization, comprising:
 determining, by data processing system, first location information identifying a location of at least one first physical asset housing in a predetermined physical area of the organization relative to a predetermined coordinate system;
 determining, by the data processing system, second location information identifying a location of at least one second physical asset housing within the at least one first asset housing;
 automatically determining, by the data processing system, third location information identifying a location of at least one computing asset within the at least one second physical asset housing;
 generating an asset location map data structure for the organization based on the first, second and third location information; and
 performing, by the data processing system, at least one management operation for managing resources of the organization, based on the asset location map data structure for the organization, wherein:
 the at least one first physical asset housing is at least one physical rack,
 the at least one second physical asset housing is at least one physical chassis within the at least one physical rack,
 the at least one computing asset is a blade server asset within the at least one physical chassis,
 the first location information comprises, for each rack in the at least one physical rack, coordinates for the rack relative to a predetermined coordinate system,
 the second location information comprises at least one of a vertical or horizontal location of the chassis within a corresponding rack in the at least one physical rack, and
 the third location information comprises a location of the at least one blade server asset within a corresponding chassis of the at least one physical chassis.

11. The method of claim 10, wherein the third location information comprises a slot identifier of a slot in the corresponding chassis where the blade server asset is physically present.

12. The method of claim 10, wherein, for each combination of a rack in the at least one physical rack, a chassis in the at least one physical chassis, and a blade server asset, the first location information, second location information, and third location information are stored in the asset location map data structure in association with one or more identifiers of the rack, the chassis, or the blade server asset.

13. The method of claim 12, further comprising:
 tracking addition and removal of blade server assets from chassis in racks of the organization using the asset location map data structure based on changes in the third location information stored in the asset location map data structure.

14. The method of claim 12, further comprising:
 storing multiple versions of the asset location map data structure over a predetermined period of time, wherein each version of the asset location map data structure identifies location information for the at least one rack, the at least one chassis, and the at least one blade server asset at a particular point in time within the predetermined period of time.

15. The method of claim 14, wherein the at least one management operation comprises generating an output identifying a change in location of one or more of the at least one rack, the at least one chassis, or the at least one blade server asset over the predetermined period of time.

16. The method of claim 10, wherein the at least one management operation comprises at least one of a searching operation for searching for location information of one of a rack, a chassis, or a blade server asset within the organization based on an identifier of the rack, chassis, or blade server asset, or a searching operation for searching for identity or configuration information of a rack, a chassis, or a blade server asset within the organization based on a specified location within the organization.

17. The method of claim 10, wherein the at least one management operation comprises outputting a report of available resources within the organization based on the first location, second location, and third location information.

18. The method of claim 10, wherein the first location information and second location information are determined either manually through user input into the data processing system or automatically by a location determination device associated with the rack.

19. A method, in a data processing system, for determining the location of computing assets within an organization, comprising:
 determining, by the data processing system, first location information identifying a location of at least one first physical asset housing in a predetermined physical area of the organization relative to a predetermined coordinate system;
 determining, by the data processing system, second location information identifying a location of at least one second physical asset housing within the at least one first asset housing;
 automatically determining, by the data processing, system, third location information identifying a location of at least one computing asset within the at least one second physical asset housing;
 generating an asset location map data structure for the organization based on the first, second and third location information; and performing, by the data processing system, at least one management operation for managing resources of the organization, based on the asset location ma data structure for the organization, wherein:

the data processing system comprises at least one first physical asset housing management module associated with the at least one first physical asset housing, and a centralized organization management module, the centralized organization management module obtains the first, second, and third location information from the at least one first physical asset housing management module, the at least one first physical asset housing is at least one physical rack, the at least one second physical asset housing is at least one physical chassis within the at least one physical rack, the at least one computing asset is a blade server asset within the at least one physical chassis, the first location information comprises, for each rack in the at least one physical rack, coordinates for the rack relative to a predetermined coordinate system, the second location information comprises at least one of a vertical or horizontal location of the chassis within a corresponding rack in the at least one physical rack, and the third location information comprises a location of the at least one blade server asset within a corresponding chassis of the at least one physical chassis.

20. The method of claim 19, wherein:

the at least one first physical asset housing management module comprises at least one rack management module that obtains the third location information from at least one chassis control module associated with the at least one physical chassis, and the centralized organization management module obtains the third location information from the at least one rack management module.

* * * * *